United States Patent
Herbordt et al.

(10) Patent No.: US 10,972,331 B2
(45) Date of Patent: Apr. 6, 2021

(54) METHOD FOR GENERATING AN OUTPUT SIGNAL HAVING PREDETERMINED JITTER CHARACTERISTICS

(71) Applicant: Rohde & Schwarz GmbH & Co. KG, Munich (DE)

(72) Inventors: Wolfgang Herbordt, Munich (DE); Martina Wollinger, Munich (DE); Markus Freidhof, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 16/776,256

(22) Filed: Jan. 29, 2020

(65) Prior Publication Data
US 2020/0252257 A1     Aug. 6, 2020

Related U.S. Application Data

(60) Provisional application No. 62/799,601, filed on Jan. 31, 2019.

(51) Int. Cl.
*H04L 27/36* (2006.01)

(52) U.S. Cl.
CPC .................. *H04L 27/362* (2013.01)

(58) Field of Classification Search
CPC ....... H04L 27/362; H04L 27/36; H04L 27/34; H04L 27/00
See application file for complete search history.

(56) References Cited

U.S. PATENT DOCUMENTS

| | | | |
|---|---|---|---|
| 5,923,701 A * | 7/1999 | Nakamura | H04L 25/4902 332/112 |
| 10,069,663 B1 * | 9/2018 | Poon | H04L 25/0278 |
| 2010/0150218 A1 * | 6/2010 | Yaginuma | H03C 3/095 375/226 |
| 2020/0209307 A1 * | 7/2020 | Martin | G01R 31/2841 |

* cited by examiner

*Primary Examiner* — Kenneth T Lam
(74) *Attorney, Agent, or Firm* — Christensen O'Connor Johnson Kindness PLLC

(57) ABSTRACT

A method for generating an output signal having predetermined jitter characteristics is disclosed. A first signal is generated via a first signal generator module. A second signal is generated via a second signal generator module. The first signal is pulse position modulated by the second signal, thereby generating a modulated signal having predetermined jitter characteristics. An output signal having predetermined jitter characteristics is generated based on the modulated signal. Moreover, a signal generator for generating an output signal having predetermined jitter characteristics is disclosed.

20 Claims, 3 Drawing Sheets

METHOD FOR GENERATING AN OUTPUT SIGNAL HAVING PREDETERMINED JITTER CHARACTERISTICS

CROSS-REFERENCE TO RELATED APPLICATION

This application claims the benefit of U.S. Provisional Application No. 62/799,601, filed Jan. 31, 2019, the disclosure of which is incorporated herein in its entirety.

FIELD OF THE DISCLOSURE

Embodiments of the present disclosure relate generally to a method for generating an output signal having predetermined jitter characteristics as well as to a signal generator for generating an output signal having predetermined jitter characteristics.

BACKGROUND

With increasing data rates, the demands on communication devices regarding maximum generated jitter and/or jitter tolerance are constantly on the rise.

For some applications, e.g. for jitter tolerance testing of a device under test, a test signal having predefined jitter characteristics is needed. Such test signals are often generated via arbitrary waveform generators (AWGs).

These AWGs usually employ a software-based signal generation, wherein the test signal having the predetermined jitter characteristics is generated based upon one or several parameters that are loaded by the software, and the test signal is then generated based on these parameters.

However, such AWGs are not capable of changing the jitter characteristics of the test signal in real time, as a change of the jitter characteristics implies changing parameters of the AWG, which have to be reloaded by the software first.

Thus, there is a need for a method as well as for a signal generator for generating an output signal having predetermined jitter characteristics that are capable of a faster adaption of the jitter characteristics.

SUMMARY

Embodiments of the present disclosure provide a method for generating an output signal having predetermined jitter characteristics. In an embodiment, a first signal is generated via a first signal generator circuit or module. A second signal is generated via a second signal generator circuit or module. The first signal is pulse position modulated by the second signal, thereby generating a modulated signal having predetermined jitter characteristics. An output signal having predetermined jitter characteristics is generated based on the modulated signal.

The disclosure is based on the rationale to use pulse position modulation of the first signal by the second signal instead of generating the output signal directly via an AWG. In other words, the first signal is the carrier signal of the modulation and the second signal is the modulating signal.

By employing this pulse-position modulation approach, the predetermined jitter characteristics can be set and/or modified by setting and/or modifying the first signal and/or the second signal, for example the second signal. This way, the predetermined jitter characteristics can be adapted in real time or at least with a delay that is in the order of magnitude of a symbol period of the output signal. For example, the delay is smaller than ten times the symbol period, for example smaller than five times the symbol period.

Thereby and in the following, the term "predetermined jitter characteristics" is understood to include both the total jitter contained in the respective signal and the individual jitter components contained in the respective signal. The modulated signal and the output signal each contain periodic jitter (PJ), random jitter (RJ), data dependent jitter (DDJ) and/or other bounded uncorrelated jitter (OBUJ). In some embodiments, the modulated signal and the output signal may each contain inter-symbol interferences (ISI) and/or duty cycle distortion (DCD).

Moreover, it is to be understood that the output signal may be identical with the modulated signal. Alternatively, the modulated signal may be further processed in order to generate the output signal based on the modulated signal.

According to one embodiment of the disclosure, the first signal is PAM-n coded, wherein n is an integer greater than 1. Accordingly, the method is not limited to binary signals (PAM-2 coded signals) since any kind of pulse-amplitude modulated signals may be generated and/or processed. Thus, the first signal comprises a sequence of symbols (bits in the PAM-2 coded case) that are generated via the first signal generator module. Each symbol takes one of n possible values, wherein signal edges are located between adjoining symbols having different values. The signal edges connect the individual symbols in a continuous and approximately linear manner, i.e. the signal edges each have a certain slope.

According to a further embodiment of the disclosure, the first signal is generated with rising edges having predefined rising slopes between pairs of different signal levels and with falling edges having predefined falling slopes between pairs of different signal levels in order to obtain a predefined duty cycle distortion in the modulated signal. In total, there are $n*(n-1)$ possible transitions between the different signal levels and, in general, the slopes or more precisely the absolute values of the slopes corresponding to each of the transitions may all be different from each other. However, at least some of the slopes may be pairwise equal to each other.

In the case of a PAM-2 coded signal, there are two different levels "low" and "high" and thus two possible transitions, namely "low to high" and "high to low". Therefore, in order to introduce a duty cycle distortion in this case, the slope of the signal edge corresponding to the transition "low to high", i.e. the rising slope, may be chosen to be different from the slope of the signal edge corresponding to the transition "high to low", i.e. the falling slope. Thus, in the case of a PAM-2 coded signal, the first signal has a trapezoidal shape.

Thereby and in the following, it is to be understood that the slope of a rising edge between two signal levels and the corresponding slope of the falling edge between the same two signal levels are considered to be equal if their absolute values are equal and are considered different from each other if their absolute values are different from each other.

According to one aspect of the disclosure, the first signal comprises at least one of a predefined symbol sequence and a pseudo-random symbol sequence. In some embodiments, in the case of the first signal being PAM-2 coded, the first signal comprises at least one of a predefined bit sequence and a pseudo-random bit sequence. The corresponding symbol sequence or bit sequence may be loaded into the first signal generator module from a memory circuit of the signal generator and/or may be received from an external signal source.

The pulse position of each signal edge of the first signal may be modulated, wherein the modulation is kept constant within each symbol. In other words, only the temporal position of each of the signal edges is adjusted while no changes are made within the symbol itself or to the respective slopes of the signal edges. Put differently, the temporal length of a symbol is only modified by shifting the signal edges defining the respective symbol and not by contracting or stretching areas within the symbol itself.

According to another aspect of the disclosure, the modulated signal is filtered via a filter in order to generate the output signal, thereby generating predefined inter-symbol interferences in the output signal. The inter-symbol interferences are part of the data dependent jitter and usually depend on certain characteristics of a transmission channel through which a signal is sent. Accordingly, defining parameters of the filter are chosen such that the filter reflects the transmission channel's transmission characteristics. This way, also the inter-symbol interference component of the total jitter is taken into account in the output signal in a particularly convenient fashion.

In another embodiment of the disclosure, the filter is a finite impulse response filter. For example, the filter is established as a low pass filter. Such a low-pass filter reflects the transmission characteristics of a finite-bandwidth medium such as a cable and therefore reproduces the inter-symbol interferences caused by the finite-bandwidth medium.

According to one aspect of the disclosure, the modulated signal is filtered with a filter sampling rate being equal to or larger than a data rate of the first signal. This way, a higher frequency resolution of the filter is provided as, in general, the frequency resolution increases with the filter sampling rate.

In another embodiment of the disclosure, the second signal comprises at least one of a periodic signal and white Gaussian noise in order to generate periodic jitter and random jitter in the modulated signal, respectively. In general, the periodic signal may have an arbitrary, but of course periodic shape. In the simplest case, the periodic signal is established as a sine-shaped signal with a certain amplitude and phase. Via the periodic signal, the periodic jitter component is imprinted on the first signal, such that the modulated signal comprises periodic jitter. More precisely, because the first signal is pulse-position modulated by second signal and the second signal comprises a periodic signal, the result of this modulation (the modulated signal) comprises periodic jitter. Similarly, the white Gaussian noise contained in the second signal imprints random jitter on the first signal, such that the modulated signal comprises random jitter. By adjusting an expectation value and/or a variance of the white Gaussian noise, an expectation value and/or a variance of the random jitter may be modified.

The periodic signal may be generated as a superposition of several sine-shaped signals. As every periodic function can be decomposed into a sum of sine- and cosine-functions, i.e. as a Fourier series, an arbitrary periodic shape of the periodic signal can be achieved this way. Put differently, an arbitrary periodic jitter component in the modulated signal and thus in the output signal can be generated by the superposition of several sine-shaped signals in the second signal.

According to a further aspect of the disclosure, a perturbation signal being uncorrelated with the first signal, the second signal and the modulated signal is generated and/or received, wherein the perturbation signal is added to the first signal, the second signal and/or the modulated signal in order to generate other bounded uncorrelated jitter in the output signal. To which of the signals the perturbation signal is added depends on the place where another, uncorrelated data stream would couple to a data signal transmitted to or received from a device under test. In other words, the place of coupling is highly dependent on the specific test conditions and the characteristics of the particular device under test.

In another embodiment of the disclosure, the perturbation signal is multiplied with a predetermined weighting factor before being added to the at least one of the first signal, the second signal and the modulated signal. In this way, different coupling strengths of the perturbation signal can be modelled.

In some embodiments, at least the modulated signal is established as a digital signal, and the modulated signal is converted to an analog signal in order to generate the output signal. In some embodiments, the first signal and/or the second signal may be established as digital signals as well.

With the method according to the disclosure, the individual jitter components described above can be added to the output signal individually and independently from each other. Put differently, each jitter component can be adjusted separately such that the method provides maximum flexibility for adjusting the total jitter and/or the individual components of the total jitter contained in the output signal.

Embodiments of the present disclosure further provide a signal generator for generating an output signal having predetermined jitter characteristics, comprising a first signal generator circuit or module, a second signal generator circuit or module and a modulation circuit or module. The first signal generator module is configured to generate a first signal and to forward the first signal to the modulation module. The second signal generator module is configured to generate a second signal and to forward the second signal to the modulation module. The modulation module is configured to pulse-position modulate the first signal by the second signal, thereby generating a modulated signal having predetermined jitter characteristics.

The disclosure is based on the rationale to use the pulse-position modulation of the first signal by the second signal instead of generating the output signal directly via an AWG. In other words, the first signal is the carrier signal of the modulation and the second signal is the modulating signal.

By employing this pulse-position modulation approach, the predetermined jitter characteristics can be set and/or modified by setting and/or modifying the first signal and/or the second signal, for example the second signal. This way, the predetermined jitter characteristics can be adapted in real time or at least with a delay that is in the order of magnitude of a symbol period of the output signal. For example, the delay is smaller than ten times the symbol period, for example smaller than five times the symbol period.

In some embodiments, the signal generator is configured to perform the above-described method for generating an output signal having predetermined jitter characteristics.

Regarding the further advantages, reference is made to the explanations given above with regard to the method for generating an output signal having predetermined jitter characteristics.

In some embodiments, the modulation module may be part of the first signal generator module. In this particular embodiment, the second signal generator module is configured to forward the second signal to the first signal generator module, more precisely to the modulation module comprised within the first signal generator module.

According to one aspect of the disclosure, the first signal generator module is configured to generate the first signal as a PAM-n coded signal with rising edges having predefined rising slopes between pairs of different signal levels and with falling edges having predefined falling slopes between pairs of different signal levels in order to obtain a predefined duty cycle distortion in the modulated signal. In total, there are n*(n−1) possible transitions between the different signal levels and, in general, the first signal generator module is configured to generate the first signal in such a way that the slopes or more precisely the absolute values of the slopes corresponding to each of the transitions all can be different from each other, although for example the slopes may be pairwise equal.

In the case of a PAM-2 coded signal, there are two different levels "low" and "high" and thus two possible transitions, namely "low to high" and "high to low". Therefore, in order to introduce a duty cycle distortion in this case, the slope of the signal edge corresponding to the transition "low to high" may be chosen to be different from the slope of the signal edge corresponding to the transition "high to low". Thus, in the case of a PAM-2 coded signal, the first signal generator module is configured to generate the first signal with a trapezoidal shape.

In another embodiment of the disclosure, the second signal generator module is configured to generate the second signal with a periodic signal and/or white Gaussian noise. In general, the periodic signal may have an arbitrary, but of course periodic shape. In the simplest case, the periodic signal is established as a sine-shaped signal with a certain amplitude and phase.

Via the periodic signal, the periodic jitter component is imprinted on the first signal, such that the modulated signal comprises periodic jitter. More precisely, because the first signal is pulse-position modulated by second signal and the second signal comprises a periodic signal, the result of this modulation (the modulated signal) comprises periodic jitter. Similarly, the white Gaussian noise contained in the second signal imprints random jitter on the first signal, such that the modulated signal comprises random jitter. By adjusting an expectation value and/or a variance of the white Gaussian noise, an expectation value and/or a variance of the random jitter may be modified.

The signal generator may comprise a finite impulse response filter downstream of the modulation module. Defining parameters of the impulse response filter are such that the filter reflects the transmission characteristics of a transmission channel to be modelled by the finite impulse response filter. This way, also the inter-symbol interference component of the total jitter is taken into account in the output signal.

For example, the filter is established as a low pass filter. Such a low-pass filter reflects the transmission characteristics of a finite-bandwidth medium such as a cable and therefore reproduces the inter-symbol interferences caused by the finite-bandwidth medium.

According to a further aspect of the disclosure, the signal generator comprises a perturbation circuit or module being configured to generate and/or receive a perturbation signal that is uncorrelated with the first signal, the second signal and the modulated signal, wherein the perturbation module is configured to add the weighted perturbation signal to at least one of the first signal, the second signal and the modulated signal. In this way, different coupling strengths of the perturbation signal can be modelled.

At least one of the first signal generator module and the second signal generator module may be established as a digital signal generator circuit.

In some embodiments, the signal generator comprises a digital-to-analog converter downstream of the modulation module.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
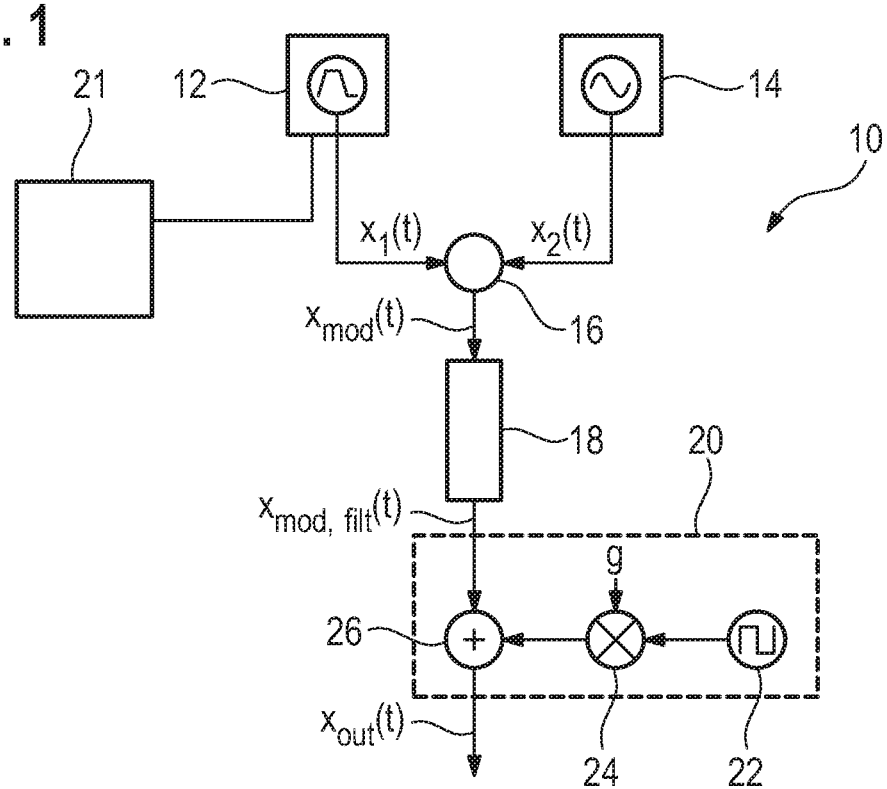
FIG. 1 shows a block diagram of a representative signal generator according to a first embodiment of the disclosure.

FIG. 1 shows a block diagram of a signal generator 10 for generating an output signal $x_{out}(t)$ having predetermined jitter characteristics. Such output signals having predetermined jitter characteristics are usually employed for testing certain properties of a device under test, for example for jitter tolerance testing of the device under test.

Thereby and in the following, the term "predetermined jitter characteristics" is understood to include both the total jitter contained in the respective signal and the individual jitter components contained in the respective signal. The modulated signal and the output signal each contain periodic jitter (PJ), random jitter (RJ), data dependent jitter (DDJ) and/or other bounded uncorrelated jitter (OBUJ). In some embodiments, the modulated signal and the output signal may each contain inter-symbol interferences (ISI) and/or duty cycle distortion (DCD).

The signal generator 10 comprises a first signal generator circuit or module 12, a second signal generator circuit or module 14, a modulation circuit or module 16, a filter 18, a perturbation circuit or module 20 and a memory 21.

The first signal generator module 12 and the second signal generator module 14 are both connected to the modulation module 16 upstream of the modulation module 16. Accordingly, signals can be sent from both the first signal generator module 12 and the second signal generator module 14 to the modulation module 16.

The filter 18 is connected to the modulation module 16 downstream of the modulation module 16 such that signals sent by the modulation module 16 are received by the filter 18.

The perturbation module 20 is connected to the filter 18 downstream of the filter 18 and comprises a perturbation signal generator 22, a weighting circuit or unit 24 and an adding circuit or unit 26.

However, the perturbation module 20 may also be connected to the both the modulation module 16 and the filter 18 downstream of the modulation module 16 and upstream of the filter 18.

Alternatively, the perturbation module 20 may be connected to the modulation module 16, the first signal generator module 12 or the second signal generator module 14 upstream of the modulation module 16. Further, the perturbation module 20 may be connected downstream of the first signal generator module 12 or the second signal generator module 14, respectively.

Figure 2:
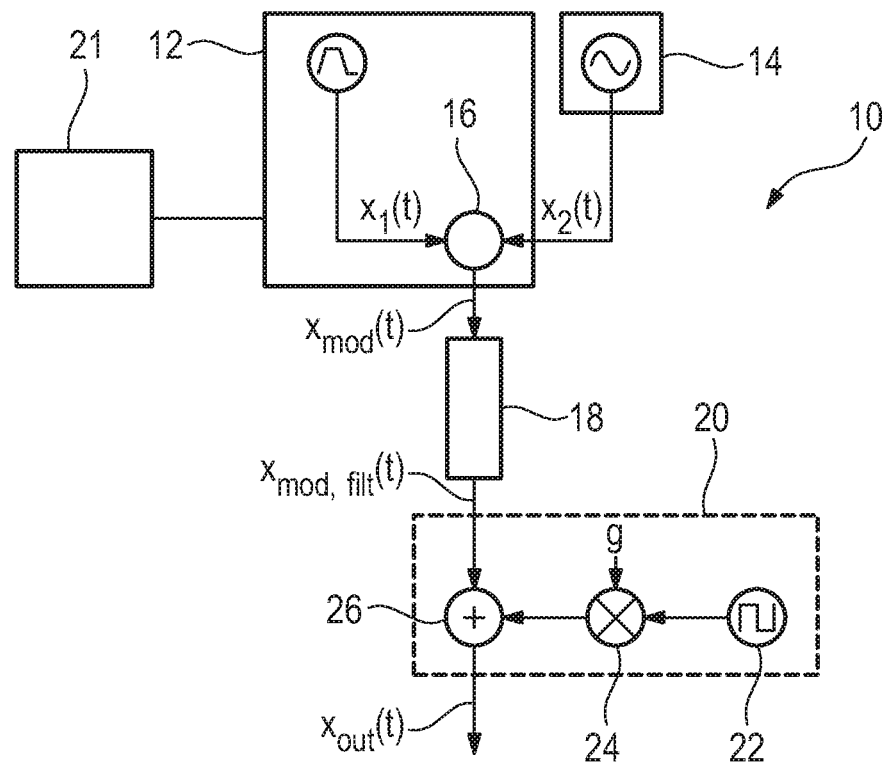
FIG. 2 shows a block diagram of a representative signal generator according to a second embodiment of the disclosure.

FIG. 2 shows another embodiment of the signal generator 10. This embodiment differs from the embodiment of FIG. 1 in that the modulation module 16 is part of the first signal generator module 12 rather than being established separately from the first signal generator module 12. The remaining parts of the signal generator 10, however, remain unchanged compared to the embodiment of FIG. 1.

Figure 3:
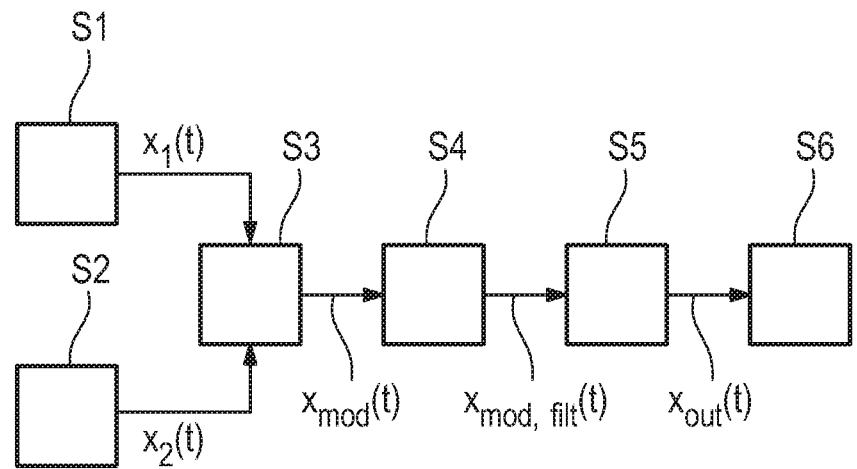
FIG. 3 shows a schematic flow chart of a representative method according to an embodiment of the disclosure.

The signal generator 10 according to the embodiments of FIGS. 1 and 2 is configured to perform a method for generating an output signal having predetermined jitter characteristics, which method is described in the following with reference to FIG. 3.

Figure 4:
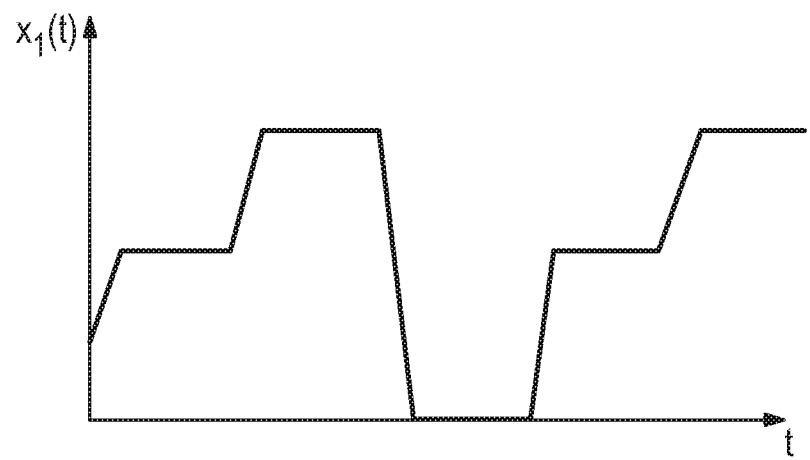
FIG. 4 shows a block diagram of a representative modulation module of a signal generator according to FIG. 1 and/or FIG. 2.

A first signal $x_1(t)$ is generated via the first signal generator (step S1). The shape of the first signal $x_1(t)$ is schematically depicted in FIG. 4.

The first signal $x_1(t)$ is a digital PAM-n coded signal, wherein n is an integer bigger than one. Thus, the first signal $x_1(t)$ comprises a sequence of symbols (bits in the PAM-2 coded case) that are generated via the first signal generator module 12.

The sequence comprised in the first signal $x_1(t)$ is at least one of predefined and pseudo-random, and is either generated by the first signal generator module 12 itself or loaded into the first signal generator module 12 from the memory 21.

Each symbol takes one of n possible values, wherein signal edges are located between adjoining symbols having different values. The signal edges connect the individual symbols in a continuous and approximately linear manner, i.e. the signal edges each have a certain slope.

The first signal $x_1(t)$ is generated with rising edges having predefined rising slopes between pairs of different signal levels and with falling edges having predefined falling slopes between pairs of different signal levels such that the first signal $x_1(t)$ has a predefined duty cycle distortion.

In total, there are n*(n−1) possible transitions between the different signal levels and, in general, the slopes or more precisely the absolute values of the slopes corresponding to each of the transitions may are different from each other. However, at least some of the slopes may be pairwise equal to each other.

In some embodiments, all slopes may be equal to each other, such that the first signal $x_1(t)$ has no duty cycle distortion in this case.

Thereby and in the following, it is to be understood that the slope of a rising edge between two signal levels and the corresponding slope of the falling edge between the same two signal levels are considered to be equal if their absolute values are equal and are considered different from each other if their absolute values are different from each other.

In the case of a PAM-2 coded signal, there are two different levels "low" and "high" and thus two possible transitions, namely "low to high" and "high to low". Therefore, in order to introduce a duty cycle distortion in this case, the slope of the signal edge corresponding to the transition "low to high" is chosen to be different from the slope of the signal edge corresponding to the transition "high to low". Thus, in the case of a PAM-2 coded signal, the first signal has a trapezoidal shape. Accordingly, the first signal generator module 12 is established as a trapezoid generator.

Moreover, a digital second signal $x_2(t)$ is generated via the second signal generator (step S2). The second signal $x_2(t)$ comprises at least one of a periodic signal and white Gaussian noise.

In general, the periodic signal has an arbitrary periodic shape, which shape may be set by a user of the signal generator 10 or may be loaded from the memory 21.

In the simplest case, the periodic signal portion of the second signal $x_2(t)$ is established as a sine-shaped signal with a certain amplitude and phase.

In general, the periodic signal portion of the second signal $x_2(t)$ is generated as a superposition of several sine-shaped signals. Thus, the second signal $x_2(t)$ has the following general form:

$$x_2(t) = \sum_{k=0}^{N} A_k \sin(\omega_k \cdot t + \theta_k) + x_{GN}.$$

Therein, $A_k$ are the amplitudes of the individual sine-shaped periodic signal portions, $\Omega_k$ are their frequencies and $\theta_k$ their phases, thus the sum in the equation above essentially represents a Fourier series of a periodic signal to be obtained. $x_{GN}$ represents the white Gaussian noise portion of the second signal $x_2(t)$, and is usually normal-distributed with a certain expected value and a certain variance.

Now, the first signal $x_1(t)$ and the second signal $x_2(t)$ are forwarded to the modulation module 16 and the first signal $x_1(t)$ is phase position modulated by the second signal $x_2(t)$, thereby generating a modulated signal $x_{mod}(t)$ (step S3). More precisely, the first signal $x_1(t)$ is the carrier signal of the modulation and the second signal $x_2(t)$ is the modulating signal of the modulation.

Figure 5:
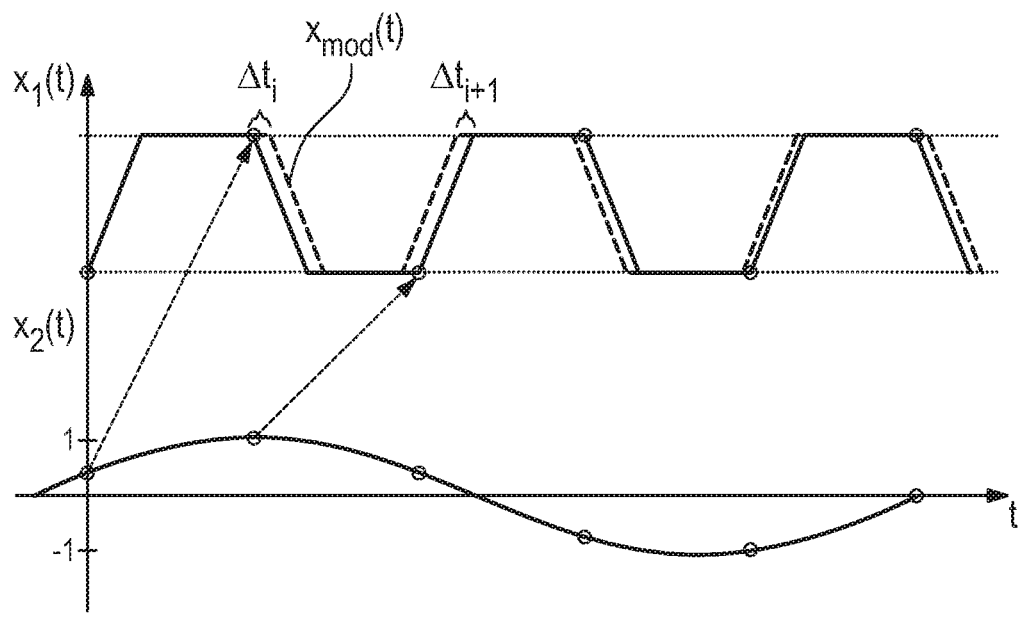
FIG. 5 shows a schematic flow chart of a representative method according to an embodiment of the disclosure.

As is illustrated in FIG. 5 for the case of a PAM-2 coded signal, the position of each signal edge of the first signal $x_1(t)$ is shifted based on the value of the second signal $x_2(t)$ at a certain time, which certain time is equal to the temporal position of the preceding signal edge of the first signal $x_1(t)$, as indicated by the arrows in FIG. 5. Thus, the temporal position $t_i$ of the i-th signal edge is shifted by a time span $\Delta_i$, as a result of the pulse position modulation.

The modulation is kept constant within each symbol. In other words, only the temporal position of each of the signal edges is adjusted while no changes are made within the symbol itself. In some embodiments, no changes are made to the slopes of the signal edges. Put differently, the temporal length of a symbol is only modified by parallel shifting of the signal edges defining the respective symbol and not by contracting or stretching areas within the symbol itself.

Figure 6:
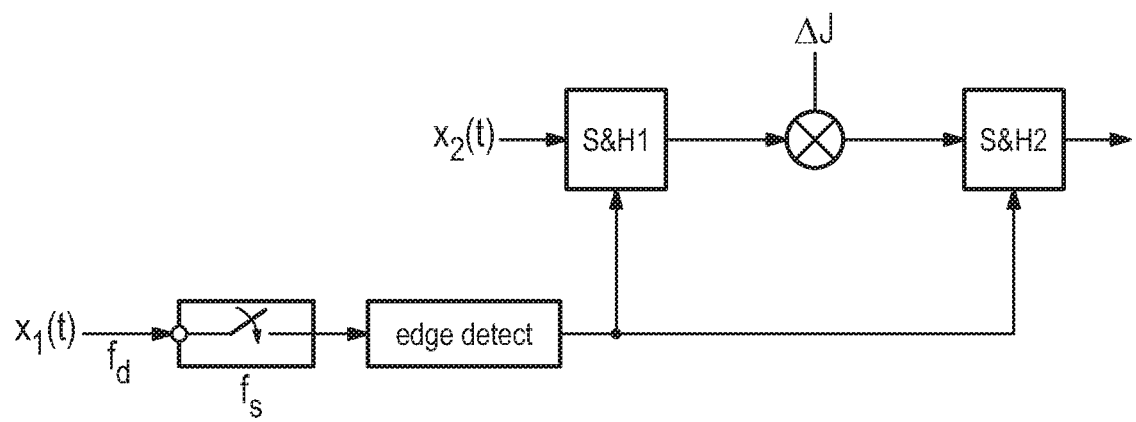
FIG. 6 shows a detailed illustration of Step S3 of the method according to FIG. 5.

Step S3 is illustrated in more detail in FIG. 6. The modulation module 16 samples the first signal $x_1(t)$ having a data rate $f_d$ with a sampling frequency $f_s$. Moreover, the modulation module 16 also samples the modulation signal via a first sample and hold circuit or member S&H1.

The modulation module 16 now detects signal edges in the first signal $x_1(t)$ and controls the first sample and hold member S&H1 based on whether a signal edge is detected or not (edge detect).

If no signal edge is detected, only the first signal $x_1(t)$ is forwarded to a second sample and hold circuit or member S&H2. Thus, if no signal edge is detected, the corresponding portion of the first signal $x_1(t)$ remains unchanged.

If a signal edge is detected, the first signal $x_1(t)$ is forwarded to the second sample and hold member S&H2. Moreover, the current value of the second signal $x_2(t)$ is scaled based on at least one jitter factor $\Delta J$ and forwarded to the second sample and hold member S&H2. The at least one jitter factor $\Delta J$ may be preset by a user and/or may be loaded from the memory 21.

More precisely, phases $\varphi_{PJ_k}(i)$ and $\varphi_{RJ}(i)$ are determined for the periodic signal components and the white Gaussian noise component of the second signal $x_2(t)$ and scaled by respective jitter factors, such that an overall phase shift $\Delta \varphi_{tot}$ is determined to be $$\Delta \varphi_{tot}(i) = \sum_{k=0}^{N} \Delta J_{PJ_k} \varphi_{PJ_k}(i) + \Delta J_{RJ} \varphi_{RJ}(i).$$

This overall phase shift $\Delta \varphi_{tot}$ is then added to the phase of the corresponding signal edge number i, such that the temporal position of the signal edge number i is shifted when output by the second sample and hold member S&H2.

As a result of the steps S1 to S3, the modulated signal $x_{mod}(t)$ contains the duty cycle distortion inherited from the first signal $x_1(t)$, periodic jitter due to the periodic signal portions of the second signal $x_2(t)$ and random jitter due to the white Gaussian noise portion of the second signal $x_2(t)$.

The modulated signal $x_{mod}(t)$ is then forwarded to the filter 18 and filtered via the filter 18, thereby generating a filtered modulated signal $x_{mod,filt}(t)$ having predefined inter-symbol interferences.

In general, defining parameters of the filter 18 are chosen such that the filter 18 reflects the characteristics of a transmission channel that is to be modelled.

The filter 18 may be established as a finite impulse response filter. For example, the filter 18 is established as a low pass filter. Such a low-pass filter reflects the transmission characteristics of a finite-bandwidth medium such as a cable and therefore reproduces the inter-symbol interferences caused by the finite-bandwidth medium.

In some embodiments, a filter sampling rate may be chosen to be equal to or larger than a data rate of the first signal $x_1(t)$.

Moreover, a perturbation signal $x_{per}(t)$ is generated and/or received by the perturbation signal generator 22, weighted with a weighting factor g by the weighting unit 24 and added to the filtered modulated signal $X_{mod,filt}(t)$ by the adding unit 26, thereby generating the output signal $x_{out}(t)$ (step S5).

Thereby, the perturbation signal $x_{per}(t)$ and the weighting factor are chosen such that a predetermined other bounded uncorrelated jitter is added to the filtered modulated signal $X_{mod,filt}(t)$ and thus comprised in the output signal $x_{out}(t)$.

Accordingly, the form of the perturbation signal $x_{per}(t)$ and/or the weighting factor may be adjustable by a user and/or loaded from the memory 21.

Finally, the output signal $x_{out}(t)$ the output signal $x_{out}(t)$ may be converted to an analog signal via a digital-to-analog converter if an analog signal is required for testing the particular device under test (step S6).

As a result of the method described above, the output signal $x_{out}(t)$ comprises predetermined jitter characteristics. More precisely, the output signal $x_{out}(t)$ comprises a predetermined duty cycle distortion, a predetermined periodic jitter, a predetermined random jitter, a predetermined other bounded uncorrelated jitter and predetermined inter-symbol interferences.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method for generating an output signal having predetermined jitter characteristics, comprising the following steps:
   generating a first signal via a first signal generator;
   generating a second signal via a second signal generator;
   pulse-position modulating the first signal by the second signal, thereby generating a modulated signal having predetermined jitter characteristics; and
   generating an output signal having predetermined jitter characteristics based on the modulated signal.

2. The method of claim 1, wherein the first signal is PAM-n coded.

3. The method of claim 2, wherein the first signal is generated with rising edges having predefined rising slopes between pairs of different signal levels and with falling edges having predefined falling slopes between pairs of different signal levels in order to obtain a predefined duty cycle distortion in the modulated signal.

4. The method of claim 2, wherein the first signal comprises at least one of a predefined symbol sequence and a pseudo-random symbol sequence.

5. The method of claim 2, wherein the pulse position of each signal edge of the first signal is modulated, wherein the modulation of the first signal by the second signal is kept constant within each symbol.

6. The method of claim 1, wherein the modulated signal is filtered via a filter in order to generate the output signal, thereby generating predefined inter-symbol interferences in the output signal.

7. The method of claim 6, wherein the filter is a finite impulse response filter.

8. The method of claim 6, wherein the modulated signal is filtered with a filter sampling rate being equal to or larger than a data rate of the first signal.

9. The method of claim 8, wherein the periodic signal is generated as a superposition of several sine-shaped signals.

10. The method of claim 1, wherein the second signal comprises at least one of a periodic signal and white Gaussian noise in order to generate periodic jitter and random jitter in the modulated signal, respectively.

11. The method of claim 1, wherein a perturbation signal being uncorrelated with the first signal, the second signal and the modulated signal is at least one of generated and received, wherein the perturbation signal is added to at least one of the first signal, the second signal and the modulated signal in order to generate other bounded uncorrelated jitter in the output signal.

12. Method according to claim 11, wherein the perturbation signal is multiplied with a predetermined weighting factor before being added to the at least one of the first signal, the second signal and the modulated signal.

13. The method of claim 1, wherein at least the modulated signal is established as a digital signal, and wherein the modulated signal is converted to an analog signal in order to generate the output signal.

14. A signal generator for generating an output signal having predetermined jitter characteristics, comprising a first signal generator circuit, a second signal generator circuit, and a modulation circuit,
   the first signal generator circuit being configured to generate a first signal and to forward said first signal to the modulation circuit;
   the second signal generator circuit being configured to generate a second signal and to forward said second signal to the modulation circuit; and
   the modulation circuit being configured to pulse-position modulate the first signal by the second signal, thereby generating a modulated signal having predetermined jitter characteristics.

15. The signal generator of claim 14, wherein the first signal generator circuit is configured to generate the first signal as a PAM-n coded signal with rising edges having predefined rising slopes between pairs of different signal levels and with falling edges having predefined falling slopes between pairs of different signal levels in order to obtain a predefined duty cycle distortion in the modulated signal.

16. The signal generator of claim 14, wherein the second signal generator circuit is configured to generate the second signal with at least one of a periodic signal and white Gaussian noise.

17. The signal generator of claim 14, comprising a finite impulse response filter module downstream of the modulation circuit.

18. The signal generator of claim 14, comprising a perturbation circuit being configured to at least one of generate and receive a perturbation signal that is uncorrelated with the first signal, the second signal and the modulated signal, wherein the perturbation module is configured to add the weighted perturbation signal to at least one of the first signal, the second signal and the modulated signal.

19. The signal generator of claim 14, wherein at least one of the first signal generator circuit and the second signal generator circuit is established as a digital signal generator.

20. The signal generator of claim 19, comprising a digital-to-analog converter downstream of the modulation circuit.

* * * * *